(12) United States Patent
Chien et al.

(10) Patent No.: US 10,922,019 B2
(45) Date of Patent: Feb. 16, 2021

(54) DATA WRITING METHOD, MEMORY CONTROLLING CIRCUIT UNIT AND MEMORY STORAGE DEVICE

(71) Applicant: PHISON ELECTRONICS CORP., Miaoli (TW)

(72) Inventors: Chia-Hung Chien, Taipei (TW); Hsiao-Hsuan Yen, Taichung (TW)

(73) Assignee: PHISON ELECTRONICS CORP., Miaoli (TW)

( * ) Notice: Subject to any disclaimer, the term of this patent is extended or adjusted under 35 U.S.C. 154(b) by 26 days.

(21) Appl. No.: 16/380,973

(22) Filed: Apr. 10, 2019

(65) Prior Publication Data
US 2020/0272358 A1  Aug. 27, 2020

(30) Foreign Application Priority Data

Feb. 25, 2019  (TW) .............................. 108106380 A

(51) Int. Cl.
| | |
|---|---|
| *G11C 7/00* | (2006.01) |
| *G06F 3/06* | (2006.01) |
| *G11C 29/52* | (2006.01) |
| *G06F 11/10* | (2006.01) |

(52) U.S. Cl.
CPC ............ *G06F 3/0659* (2013.01); *G06F 3/064* (2013.01); *G06F 3/0619* (2013.01); *G06F 3/0679* (2013.01); *G06F 11/1068* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 2002/0172081 A1* | 11/2002 | Mukaida | ............. | G06F 12/0246 365/200 |
| 2010/0162083 A1* | 6/2010 | Chung | ................ | G06F 11/1068 714/764 |
| 2012/0317458 A1* | 12/2012 | So | ..................... | H03M 13/3715 714/763 |
| 2017/0300379 A1* | 10/2017 | Liang | .................... | G06F 3/0604 |

* cited by examiner

*Primary Examiner* — Ryan Bertram
*Assistant Examiner* — Trang K Ta
(74) *Attorney, Agent, or Firm* — JCIPRNET

(57) ABSTRACT

A data writing method, a memory controlling circuit unit and a memory storage device are provided. The method includes: receiving a plurality of data from a host system, and writing the data into a plurality of first physical programming units; performing a multi-frame encoding according to the plurality of data to generate encoded data, and writing the encoded data into a second physical programming unit; and writing a plurality of first concatenated information related to the encoded data into the plurality of first programming units, respectively.

24 Claims, 11 Drawing Sheets

| Lower physical programming unit | Middle physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 10

DATA WRITING METHOD, MEMORY CONTROLLING CIRCUIT UNIT AND MEMORY STORAGE DEVICE

CROSS-REFERENCE TO RELATED APPLICATION

This application claims the priority benefit of Taiwan application serial no. 108106380, filed on Feb. 25, 2019. The entirety of the above-mentioned patent application is hereby incorporated by reference herein and made a part of this specification.

BACKGROUND

Technical Field

The invention relates to a data writing method, a memory controlling circuit unit and a memory storage device.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

In general, when reading data in a physical programming unit, the data read from the physical programming unit may first be decoded by using encoded data of a single-frame encoding for an error checking and correcting. However, when the decoding performed by using the encoded data of the single-frame encoding fails, encoded data of a multi-frame encoding and a plurality of data for generating the encoded data of the multi-frame encoding may be read and a decoding may be performed according to the encoded data of the multi-frame encoding and the data for generating the encoded data, so as to attempt correcting errors existing in the data stored by the currently read physical programming unit.

Nonetheless, an error checking and correcting capability of the encoded data of the multi-frame encoding is positively proportional to the number of bits of the encoded data of the multi-frame encoding. When the number of bits of the encoded data of the multi-frame encoding is smaller, a problem of the error checking and correcting capability of the encoded data of the multi-frame encoding being lower may arise. In addition, when a format of the physical programming unit for storing data written by a host system is different from a format of the physical programming unit for storing the encoded data of the multi-frame encoding, complexity in algorithm design and costs in hardware design may both be increased. Further, if the encoded data of the multi-frame encoding is stored in a physical erasing unit and the physical erasing unit is different from a physical erasing unit where the data written by the host system are located, the time for writing and reading the encoded data of the multi-frame encoding may be increased.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the invention provides a data writing method, a memory controlling circuit unit and a memory storage device capable of increasing the number of bits of the encoded data to improve the error checking and correcting capability of the encoded data, reducing complexity in algorithm design and costs in hardware design and reducing the time for writing and reading data.

The invention proposes a data writing method for a rewritable non-volatile memory module. The rewritable non-volatile memory module has a plurality of physical erasing units, and each physical erasing unit among the physical erasing units has a plurality of physical programming units. The data writing method includes: receiving a plurality of data from a host system, and writing the plurality of data into i first physical programming units among the plurality of physical programming units, respectively, wherein i is a positive integer greater than 0; performing a multi-frame encoding according to the plurality of data to generate encoded data, and writing the encoded data into a second physical programming unit among the plurality of physical programming units; and writing a plurality of first concatenated information related to the encoded data into the i first physical programming units, respectively, wherein the plurality of first concatenated information are configured to record locations of the plurality of data in the i first physical programming units.

The invention proposes a memory controlling circuit unit for a rewritable non-volatile memory module. The rewritable non-volatile memory module has a plurality of physical erasing units, and each physical erasing unit among the physical erasing units has a plurality of physical programming units. The memory controlling circuit unit includes a host interface, a memory interface and a memory management circuit. The host interface is configured to couple to a host system. The memory interface is configured to couple to a rewritable non-volatile memory module. The memory management circuit is coupled to the host interface and the memory interface. The memory management circuit is configured to perform the following operations: receiving a plurality of data from a host system, and writing the plurality of data into i first physical programming units among the plurality of physical programming units, respectively, wherein i is a positive integer greater than 0; performing a multi-frame encoding according to the plurality of data to generate encoded data, and writing the encoded data into a second physical programming unit among the plurality of physical programming units; and writing a plurality of first concatenated information related to the encoded data into the i first physical programming units, respectively, wherein the plurality of first concatenated information are configured to record locations of the plurality of data in the i first physical programming units.

The invention proposes a memory storage device, which includes a connection interface unit, a rewritable non-volatile memory module and a memory controlling circuit unit. The connection interface unit is configured to couple to a host system. The rewritable non-volatile memory module has a plurality of physical erasing units, and each physical erasing unit among the physical erasing units includes a plurality of physical programming units. The memory controlling circuit unit is coupled to the connection interface unit and the rewritable non-volatile memory module. The memory controlling circuit unit is configured to perform the following operations: receiving a plurality of data from a host system, and writing the plurality of data into i first physical programming units among the plurality of physical programming units, respectively, wherein i is a positive integer greater than 0; performing a multi-frame encoding according to the plurality of data to generate encoded data, and writing the encoded data into a second physical programming unit among the plurality of physical programming units; and writing a plurality of first concatenated information related to the encoded data into the i first physical programming units, respectively, wherein the plurality of first concatenated information are configured to record locations of the plurality of data in the i first physical programming units.

Based on the above, the data writing method, the memory controlling circuit unit and the memory storage device of the invention can increase the number of bits of the encoded data to improve the error checking and correcting capability of the encoded data. Further, in the data writing method of the invention, because the format of the physical programming unit for storing data written by the host system is identical the format of the physical programming unit for storing the encoded data of the multi-frame encoding, complexity in algorithm design and costs in hardware design may both be reduced. Further, in the data writing method of the invention, because the encoded data and the data for generating the encoded data are stored in the same physical erasing unit, the time for writing and reading the encoded data may be reduced.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 10 is a schematic diagram illustrating a physical erasing unit according to an exemplary embodiment.

DETAILED DESCRIPTION

Figure 1:
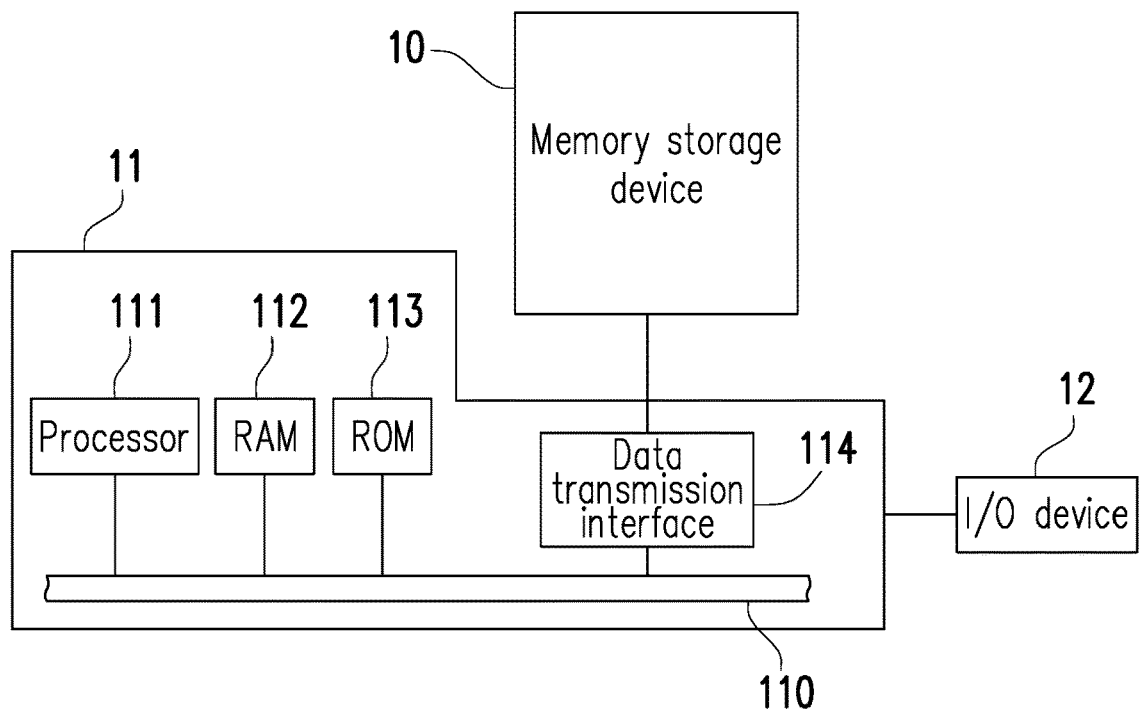
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

FIG. 1 is a schematic diagram illustrating a host system, a memory storage device and an I/O (input/output) device according to an exemplary embodiment of the invention.

Figure 2:
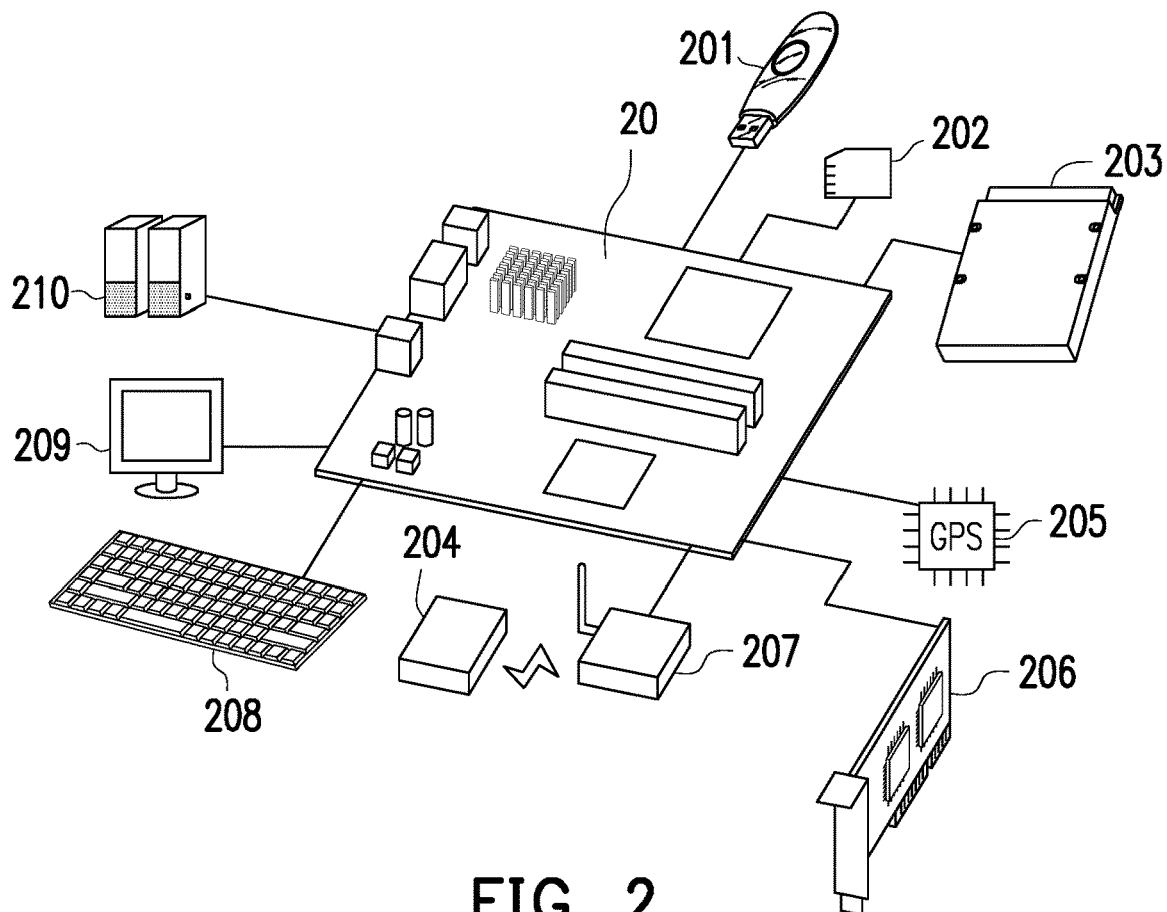
FIG. 2 is a schematic diagram illustrating a host system, a memory storage device and an I/O device according to another exemplary embodiment of the invention.

FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 510 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
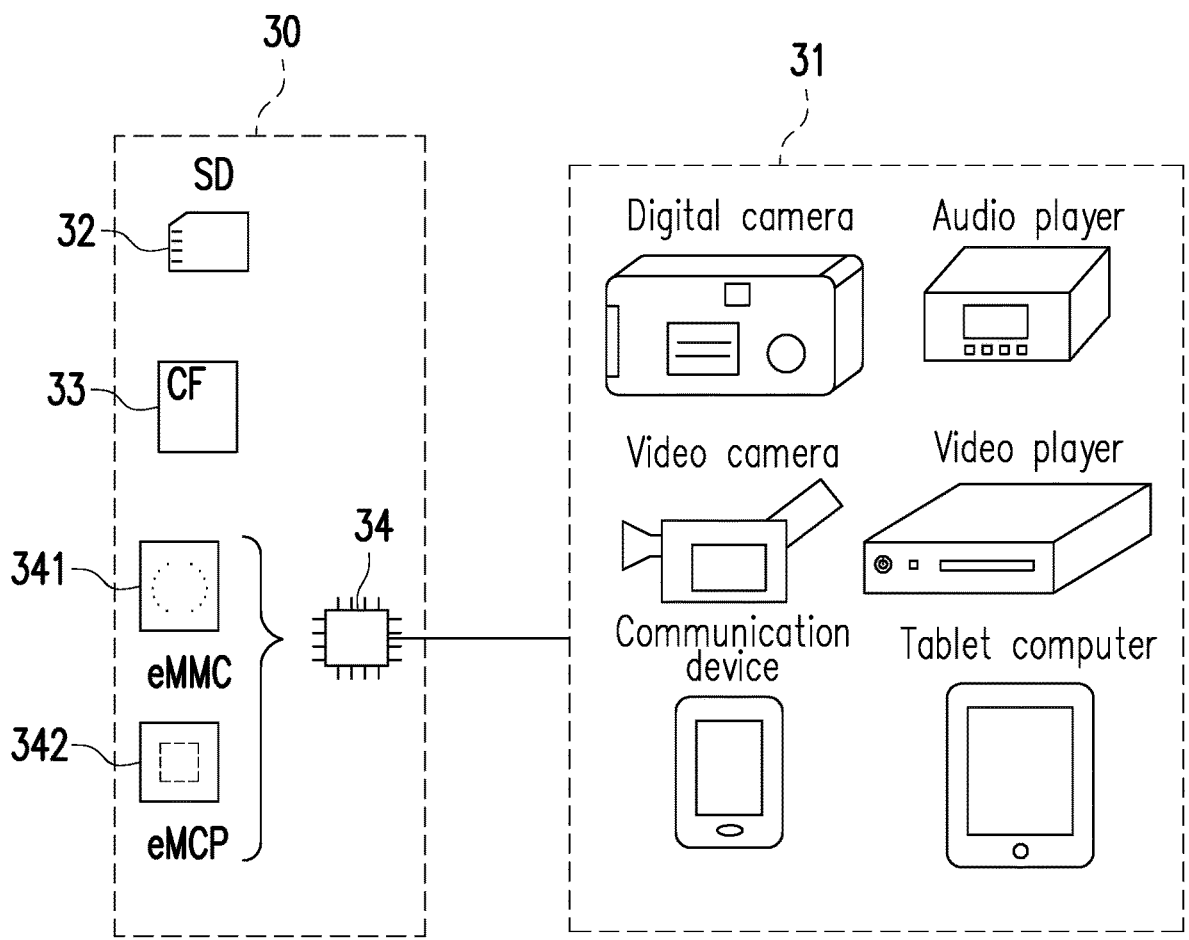
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system including a digital camera, a video camera, a communication device, an audio player, a video player or a tablet computer, whereas a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
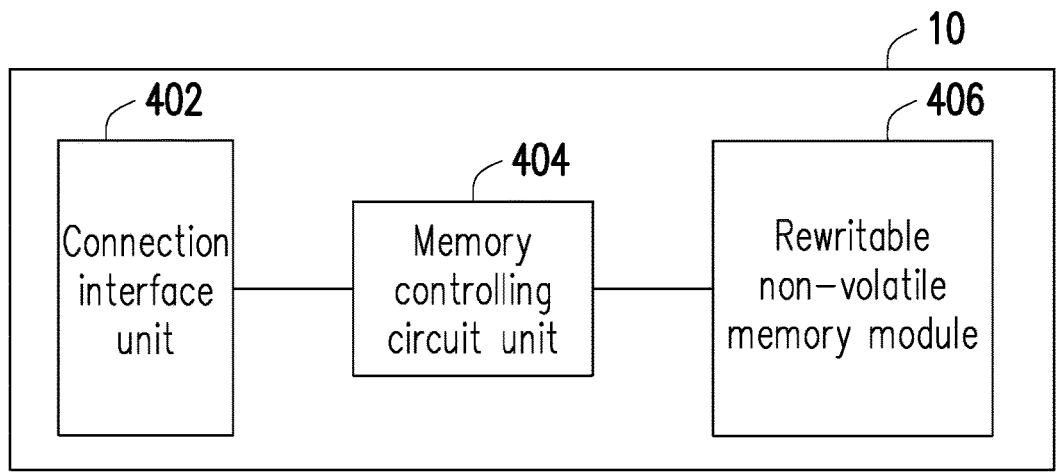
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory controlling circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the invention is not limited in this regard. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory controlling circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

The memory cells in the rewritable non-volatile memory module 406 are disposed in an array. The memory cell array is described below using a two-dimensional array. However, it should be noted that, the following exemplary embodiment is simply an example of the memory cell array. In other exemplary embodiments, a disposition method of the memory cell array may be adjusted to satisfy actual requirements.

Figure 5:
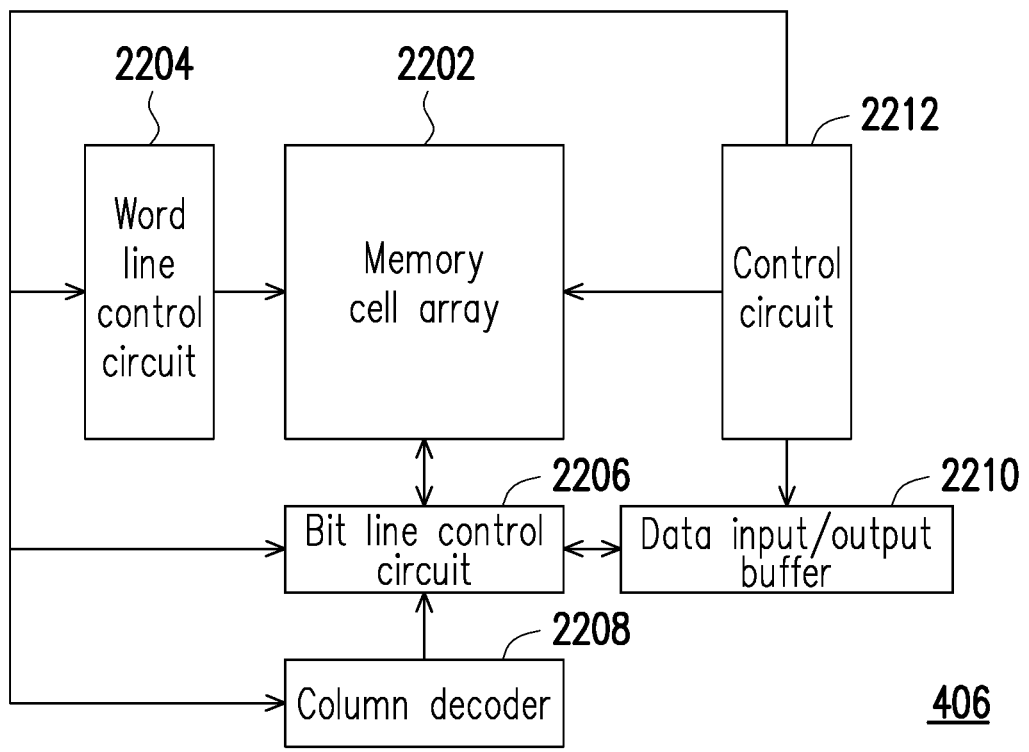
FIG. 5 is a schematic block diagram illustrating a rewritable non-volatile memory module according to an exemplary embodiment.
Figure 6:
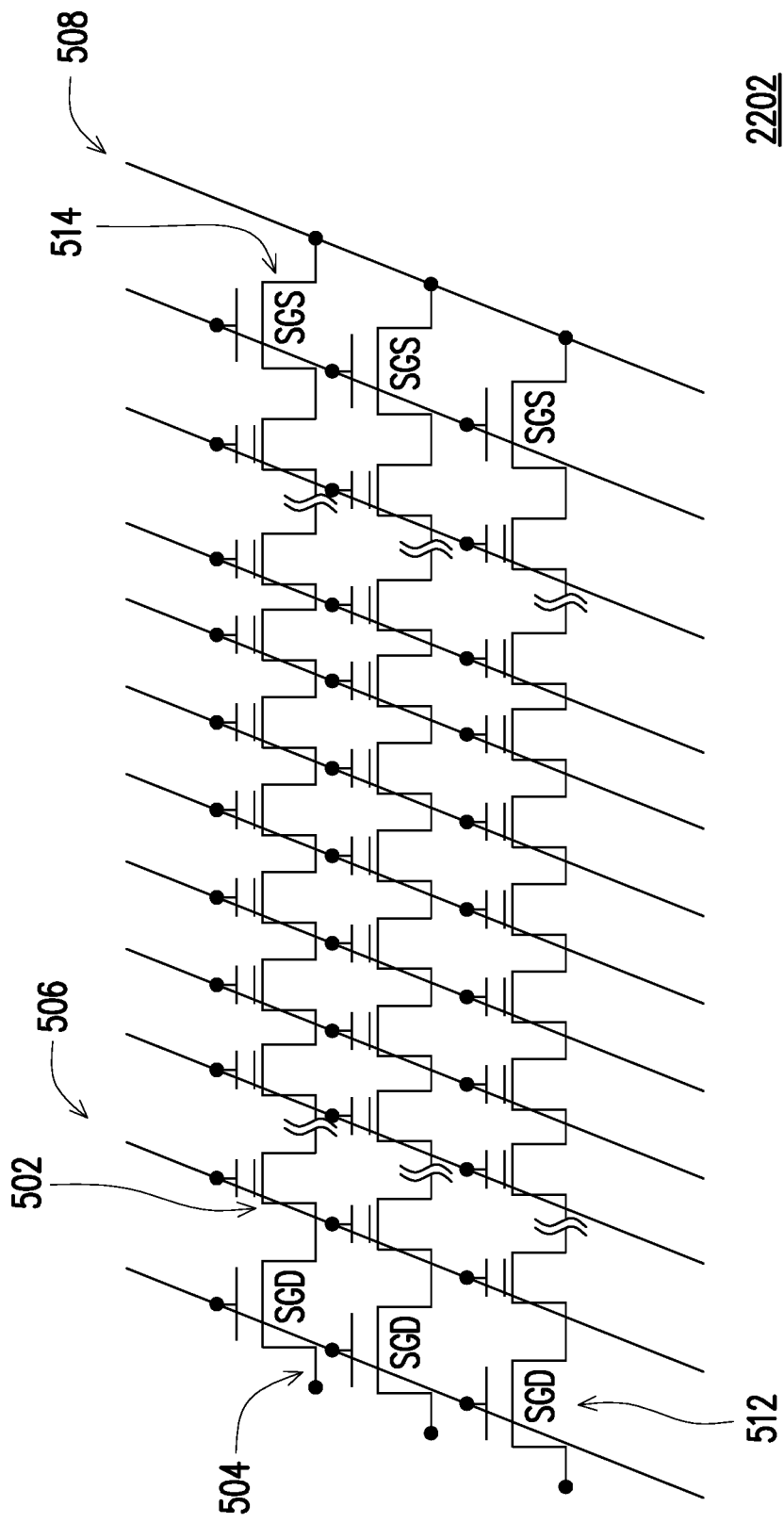
FIG. 6 is a schematic diagram illustrating a memory cell array according to an exemplary embodiment.

FIG. 5 is a schematic block diagram illustrating a rewritable non-volatile memory module according to an exemplary embodiment. FIG. 6 is a schematic diagram illustrating a memory cell array according to an exemplary embodiment.

Referring to FIG. 5 and FIG. 6 together, the rewritable non-volatile memory module 406 includes a memory cell array 2202, a word line control circuit 2204, a bit line control circuit 2206, a column decoder 2208, a data input/output buffer 2210 and a control circuit 2212.

In the present exemplary embodiment, the memory cell array 2202 may include a plurality of memory cells 502 for storing data, a plurality of select gate drain (SGD) transistors 512, a plurality of select gate source (SGS) transistors 514, a plurality of bit lines 504, a plurality of word lines 506, and a common source line 508, where the bit lines 434, the word lines 436, and the common source line 438 are connected to the memory cells (as shown in FIG. 6). The memory cell 502 is disposed at intersections of the bit lines 504 and the word lines 506 in a matrix manner (or in a 3D stacking manner). When receiving a write command or a read command from the memory controlling circuit unit 404, the control circuit 2212 controls the word line control circuit 2204, the bit line control circuit 2206, the column decoder 2208, the data input-output buffer 2210 to write the data into the memory cell array 2202 or read the data from the memory cell array 2202, wherein the word line control circuit 2204 is configured to control voltages applied to the word lines 506, the bit line control circuit 2206 is configured to control voltages applied to the bit lines 504, the column decoder 2208 is configured to select the corresponding bit line according to a row address in a command, and the data input/output buffer 2210 is configured to temporarily store the data.

The memory cell in the rewritable non-volatile memory module 406 may store multiple bits by changing a threshold voltage of one memory cell. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell". Each of the memory cells in the memory cell array 2022 has a plurality of storage statuses depended on changes in the threshold voltage. A read voltage can be used to determine what storage state the memory cell belongs to, so as to obtain the bit stored by the memory cell.

Figure 7:
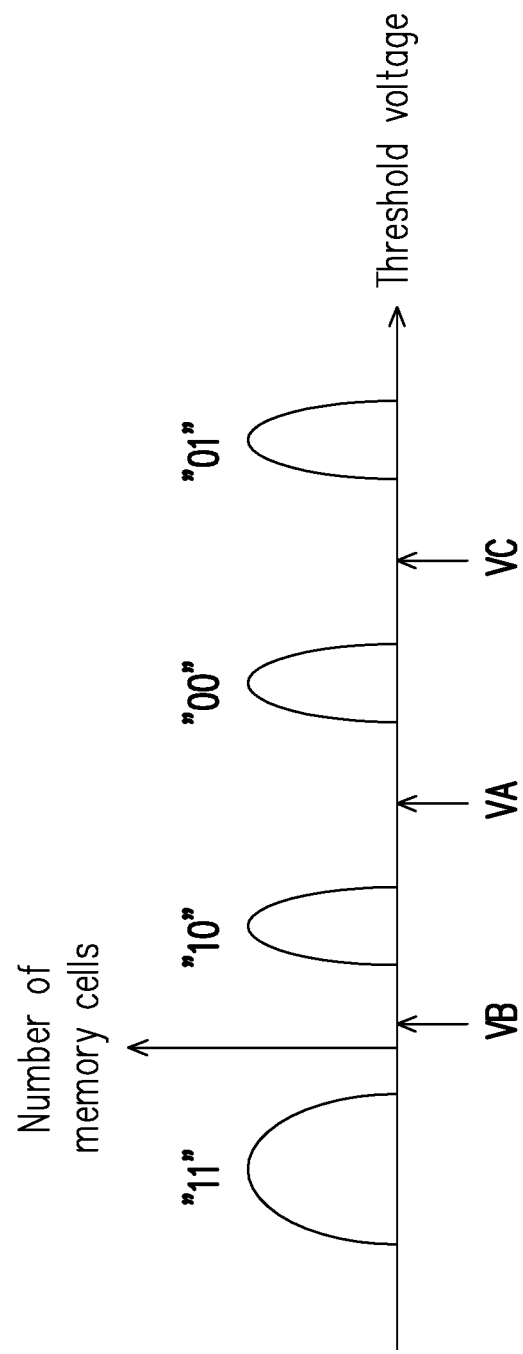
FIG. 7 is a histogram of a gate voltage corresponding to write data stored in the memory cell array according to an exemplary embodiment.

FIG. 7 is a histogram of a gate voltage corresponding to write data stored in the memory cell array according to an exemplary embodiment.

Referring to FIG. 7 that takes the MLC NAND flash memory for example, in which each of the memory cells has four storage states depending on different threshold voltages, and the storage states represent bits "11", "10", "00" and "01", respectively. In other words, each of the storage states includes a least significant bit (LSB) and a most significant bit (MSB). In the present exemplary embodiment, among the storage states (i.e., "11", "10", "00" and "01"), a first bit counted from the left is the LSB, and a second bit counted from the left is the MSB. Accordingly, in this exemplary embodiment, each of the memory cells can store two bits. It should be understood that, the threshold voltages and the corresponding storage states illustrated in the FIG. 7 are merely an example. In another exemplary embodiment of the invention, the threshold voltages and the corresponding storage states may also have an arrangement of "11", "10", "01" and "00" that is arranged according to the threshold voltage from small to large, or have other arrangements. In addition, in another exemplary embodiment, it can also be defined that the first bit counted from the left is the MSB, and the second bit counted from the left is the LSB.

In an exemplary embodiment where one memory cell is capable of storing multiple bits (e.g., the MLC or TLC flash memory module), the physical programming units belonging to the same word line may at least be classified into a lower physical programming unit and an upper physical programming unit. For instance, in the MLC NAND flash memory module, a least significant bit (LSB) of a memory cell belongs to the lower physical programming unit, and a most significant bit (MSB) of one memory cell belongs to the upper physical programming unit. In an exemplary embodiment, the lower physical programming unit is also known as a fast page, and the upper physical programming unit is also known as a slow page. In addition, in the TLC NAND flash memory module, a least significant bit (LSB) of a memory cell belongs to the lower physical programming unit, a center significant bit (CSB) of that memory cell belongs to a middle physical programming unit, and a most significant bit (MSB) of that memory cell belongs to the upper physical programming unit.

Figure 8:
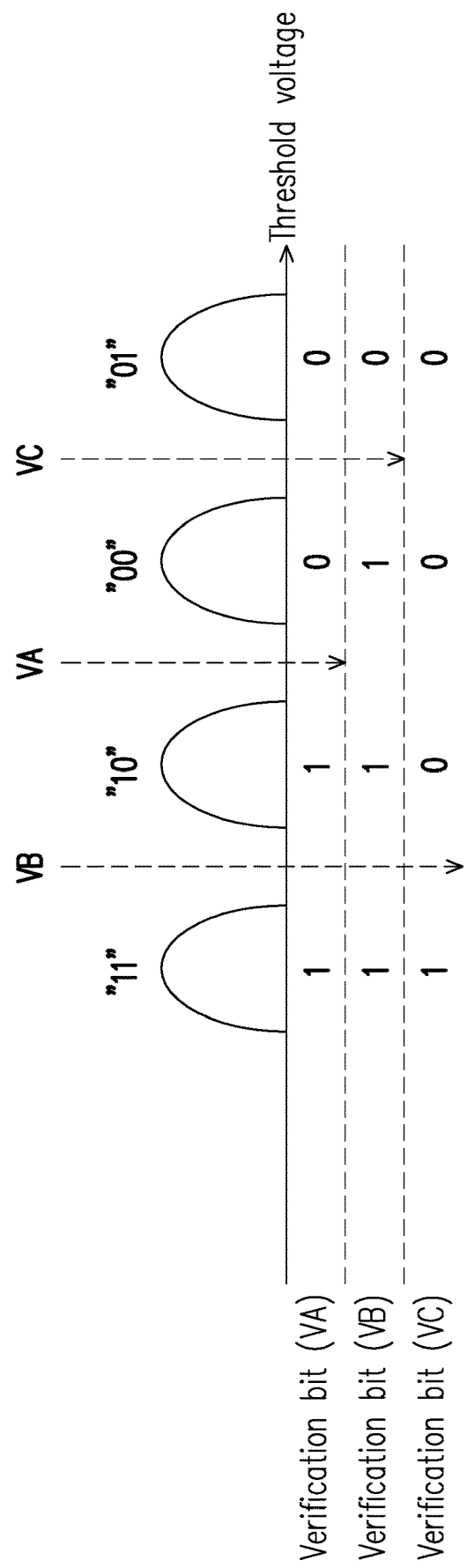
FIG. 8 illustrates a schematic diagram of reading data from a memory cell according to an exemplary embodiment.

FIG. 8 illustrates a schematic diagram for reading data from a memory cell according to an exemplary embodiment, in which a MLC NAND flash memory is used as an example.

Referring to FIG. 8, in a reading operation for the memory cells of the memory cell array 2202, read voltages VA to VC are applied to the control gate, and data stored in the memory cells are identified according whether the channel of the memory cell is turned on. A verification bit (VA) is configured to indicate whether the channel of the memory cell is turned on when a read voltage VA is applied; a verification bit (VC) is configured to indicate whether the channel of the memory cell is turned on when a read voltage VC is applied; and a verification bit (VB) is configured to indicate whether the channel of the memory cell is turned on when a read voltage VB is applied. Here, it is assumed that the corresponding memory cell channel is turned on when the verification bit is "1", and the corresponding memory cell channel is not turned on when the verification bit is "0". As shown in FIG. 8, the storage state of the memory cell may be determined according to the verification bits (VA) to (VC) so the bits stored can be obtained.

Figure 9:
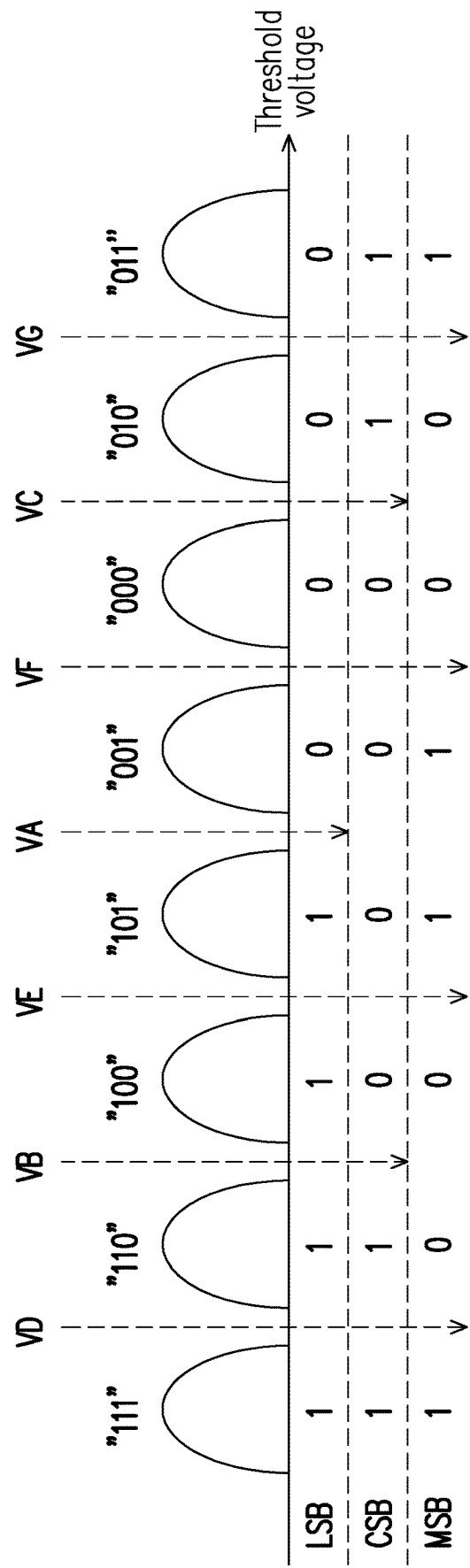
FIG. 9 illustrates a schematic diagram of reading data from a memory cell according to another exemplary embodiment.

FIG. 9 illustrates a schematic diagram of reading data from a memory cell according to another exemplary embodiment.

With reference to FIG. 9 in which the TLC NAND flash memory is taken as an example, each of the storage states includes a first bit counted from the left being the least significant bit (LSB), a second bit counted from the left being a center significant bit (CSB) and a third bit counted from the left being the most significant bit (MSB). In this embodiment, the memory cell includes eight storage states depending on different threshold voltages (i.e., "111", "110", "100", "101", "001", "000", "010" and "011"). The bits stored in the memory cell may be identified by applying the read voltages VA to VC to the control gate.

Here, it should be noted that, an arranging sequence of the eight storage states in FIG. 9 may be decided based on manufacturer designs instead of being limited by the arranging sequence of this embodiment.

In addition, the memory cells of the rewritable non-volatile memory module 406 constitute a plurality of physical programming units, and the physical programming units constitute a plurality of physical erasing units. Specifically, the memory cells on the same word line in FIG. 6 constitute one or more of the physical programming units. For example, if the rewritable non-volatile memory module 406 is the MLC NAND flash memory module, the memory cells on intersections between the same word line and the bit lines constitute 2 physical programming units, i.e., the upper physical programming unit and the lower physical programming unit. In this case, one upper physical programming unit and one lower physical programming unit may be collectively referred to as a physical programming unit group. In particular, if data to be read is located in a lower physical programming unit of a physical programming unit group, the read voltage VA in FIG. 8 may be adopted to identify each bit value in the lower physical programming unit. If data to be read is located in an upper physical programming unit of a physical programming unit group, the read voltage VB and the read voltage VC in FIG. 8 may be adopted to identify each bit value in the upper physical programming unit.

Alternatively, if the rewritable non-volatile memory module 406 is the TLC NAND flash memory module, the memory cells on intersections between the same word line and the bit lines constitute 3 physical programming units, i.e., the upper physical programming unit, the middle physical programming unit and the lower physical programming unit. In this case, one upper physical programming unit, one middle physical programming unit and one lower physical programming unit may be collectively referred to as a physical programming unit group. In particular, if data to be read is located in a lower physical programming unit of a physical programming unit group, the read voltage VA in FIG. 9 may be adopted to identify each bit value in the lower physical programming unit. If data to be read is located in a middle physical programming unit of a physical programming unit group, the read voltage VB and the read voltage VC in FIG. 9 may be adopted to identify each bit value in the middle physical programming unit. If data to be read is located in an upper physical programming unit of a physical programming unit group, the read voltage VD, the read voltage VE and the read voltage VF and the read voltage VG in FIG. 9 may be adopted to identify each bit value in the upper physical programming unit.

In this exemplary embodiment, the physical programming unit is the minimum unit for programming. That is, the physical programming unit is the minimum unit for writing data. For example, the physical programming unit is a physical page or a physical sector. If the physical programming unit is the physical page, these physical programming units usually include a data bit area and a redundancy bit area. The data bit area includes multiple physical sectors configured to store user data, and the redundant bit area is configured to store system data (e.g., an error correcting code). In this exemplary embodiment, the data bit area contains 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

FIG. 10 is a schematic diagram illustrating a physical erasing unit according to an exemplary embodiment.

With reference to FIG. 10, in this exemplary embodiment, it is assumed that one physical erasing unit is constituted by a plurality of physical programming unit groups. Each of the physical programming unit groups includes the lower physical programming unit, the center physical programming unit and the upper physical programming unit constituted by multiple memory cells arranged on the same word line. For example, in the physical erasing unit, the 0-th physical programming unit belonging to the lower physical programming unit, the 1-st physical programming unit belonging to the center physical erasing unit and the 2-nd physical programming unit belonging to the upper physical programming unit are regarded as one physical programming unit group. Similarly, the 3-rd, the 4-th, and the 5-th physical programming units are regarded as one physical programming unit group, and by analogy, the other physical programming units are also grouped into multiple physical programming unit groups by the same method.

Figure 11:
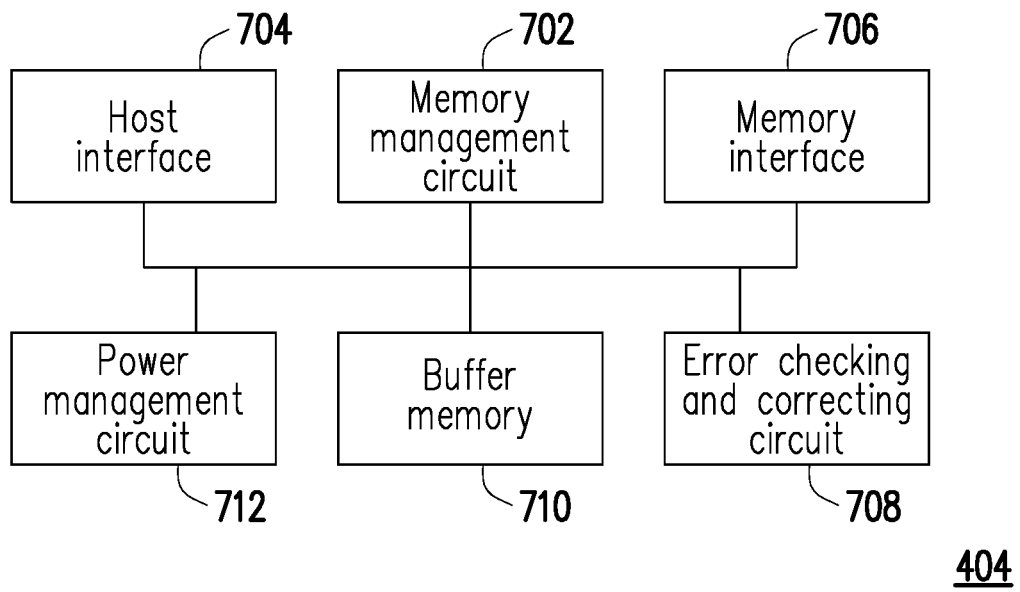
FIG. 11 is a schematic block diagram illustrating a memory controlling circuit unit according to an exemplary embodiment of the invention.

FIG. 11 is a schematic block diagram illustrating a memory controlling circuit unit according to an exemplary embodiment of the invention.

Referring to FIG. 11, the memory controlling circuit unit 404 includes a memory management circuit 702, a host interface 704, a memory interface 706 and an error checking and correcting circuit 708.

The memory management circuit 702 is configured to control overall operations of the memory controlling circuit unit 404. Specifically, the memory management circuit 702 has a plurality of control commands. When the memory storage device 10 operates, the control commands are executed to perform various operations such as data writing, data reading and data erasing. Hereinafter, description regarding operations of the memory management circuit 702 or any circuit element in the memory controlling circuit unit 404 is equivalent to description regarding operations of the memory controlling circuit unit 404.

In this exemplary embodiment, the control commands of the memory management circuit 702 are implemented in form of firmware. For instance, the memory management circuit 702 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 702 may also be stored as program codes in a specific area (for example, the system area in a memory exclusively used for storing system data) of the rewritable non-volatile memory module 406. In addition, the memory management circuit 702 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 702 when the memory controlling circuit unit 404 is enabled. Then, the control commands are executed by the microprocessor unit to perform operations, such as writing, reading or erasing data.

Further, in another exemplary embodiment, the control commands of the memory management circuit 702 may also be implemented in a form of hardware. For example, the memory management circuit 702 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to issue a read command sequence for the rewritable non-volatile memory module 406 in order to read data from the rewritable non-volatile memory module 406. The memory erasing circuit is configured to issue an erase command sequence for the rewritable non-volatile memory module 8406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 702 may further give command sequence of other types to the rewritable non-volatile memory module 406 for instructing to perform the corresponding operations.

The host interface 704 is coupled to the memory management circuit 702 and configured to receive and identify commands and data sent from the host system 11. In other words, the commands and data transmitted by the host system 11 are transmitted to the memory management circuit 702 via the host interface 704. In this exemplary embodiment, the host interface 704 is compatible with the SATA standard. Nevertheless, it should be understood that the invention is not limited in this regard. The host interface 704 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 706 is coupled to the memory management circuit 702 and configured to access the rewritable non-volatile memory module 406. In other words, data to be written into the rewritable non-volatile memory module 406 is converted into a format acceptable by the rewritable non-volatile memory module 406 via the memory interface 706. Specifically, if the memory management circuit 702 intends to access the rewritable non-volatile memory module 406, the memory interface 706 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 702 and transmitted to the rewritable non-volatile memory module 406 through the memory interface 706, for example. The command sequences may include one or more signals, or data transmitted in the bus. The signals or the data may include command codes and program codes. For example, information such as identification codes and memory addresses are included in the read command sequence.

The error checking and correcting circuit 708 is coupled to the memory management circuit 702 and configured to perform an error checking and correcting operation to ensure integrity of data. Specifically, when the memory management circuit 702 receives the writing command from the host system 11, the error checking and correcting circuit 708 generates an error correcting code (ECC) or an error detecting code (EDC) for data corresponding to the writing command, and the memory management circuit 702 writes data and the ECC or the EDC corresponding to the writing command to the rewritable non-volatile memory module 406. Then, when the memory management circuit 702 reads the data from the rewritable non-volatile memory module 406, the corresponding ECC and/or the EDC are also read, and the error checking and correcting circuit 708 performs the error checking and correcting operation on the read data based on the ECC and/or the EDC.

In an exemplary embodiment, the memory controlling circuit unit 404 further includes a buffer memory 710 and a power management circuit 712.

The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 10.

It is noted that in the following description, some terms may be replaced with corresponding abbreviations for ease of reading (see Table 1).

TABLE 1

| | |
|---|---|
| rewritable non-volatile memory module | RNVM module |
| physical programming unit | PPU |
| physical erasing unit | PEU |
| memory management circuit | MMC |

In this exemplary embodiment, the error checking and correcting circuit 708 can perform a single-frame encoding for the data stored in the same PPU and can also perform a multi-frame encoding for data stored in multiple PPUs. Each of the single-frame encoding and the multi-frame encoding may adopt encoding algorithms including at least one of a LDPC (low density parity code), a BCH code, a convolutional code or a turbo code. Alternatively, in another exemplary embodiment, the multi-frame encoding may also include a RS codes (Reed-solomon codes) algorithm or an XOR (exclusive OR) algorithm. Further, in another exemplary embodiment, more of other encoding algorithms not listed above may also be adopted, which are omitted herein. According to the adopted encoding algorithm, the error check and correction circuit 708 can encode the data to be protected, so as to generate the corresponding ECC and/or the EDC. For clear description, the ECC and/or the EDC generated by encoding are collectively referred to as encoded data.

Figure 12:
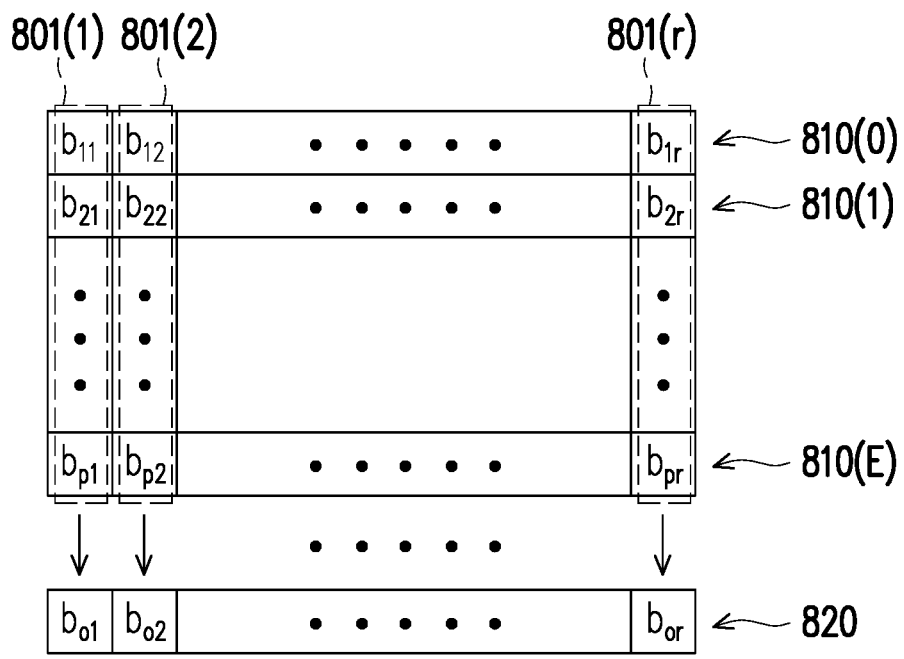
FIG. 12 is a schematic diagram illustrating a multi-frame encoding according to an exemplary embodiment of the invention.

FIG. 12 is a schematic diagram illustrating a multi-frame encoding according to an exemplary embodiment of the invention.

With reference to FIG. 12 that takes encoded data 820 correspondingly generated by encoding the data stored in PPUs 810(0) to 810(E) as an example, in which at least a part of data stored by each of the PPUs 810(0) to 810(E) may be regarded as one frame. In the multi-frame encoding, the data in the PPUs 810(0) to 810(E) are encoded based on each of positions where bits (or bytes) are located. For example, bits $b_{11}, b_{21}, \ldots, b_{p1}$ at a position 801(1) are encoded as a bit $b_{o1}$ in the encoded data 820 and bits $b_{12}, b_{22}, \ldots, b_{p2}$ at a position 801(2) are encoded as a bit $b_{o2}$ in the encoded data 820; and by analogy, bits $b_{1r}, b_{2r}, \ldots, b_{pr}$ at a position 801(r) are encoded as a bit $b_{or}$ in the encoded data 820. Later, the data read from the PPUs 810(0) to 810(E) may be decoded according to the encoded data 820 so as to attempt correcting possible errors existing in the read data.

Further, in another exemplary embodiment of FIG. 12, the data used for generating the encoded data 820 may also include redundancy bits corresponding to the data bits in the data stored in the PPUs 810(0) to 810(E). With the data stored in the PPU 810(0) taken as an example, the redundancy bits therein are, for example, generated by performing the single-frame encoding for the data bits stored in the PPU 810(0). In this exemplary embodiment, it is assumed that when the data of the PPU 810(0) is read, the data read from the PPU 810(0) may be decoded by the redundancy bits (e.g., the encoded data of the single-frame encoding) in the PPU 810(0) so as to perform the error check and correct operation. However, when a decoding operation performed by using the redundancy bits in the PPU 810(0) fails (e.g., the number of error bits of the data stored in the PPU 810(0) is greater than a threshold), the encoded data 820 and data of the PPUs 810(1) to 810(E) may be read and a decoding may be performed according to the encoded data 820 and the data of the PPUs 810(1) to 810(E) to attempt correcting errors existing in the data stored in the PPU 810(0). In other words, in this exemplary embodiment, when the decoding performed by using the encoded data generated by the single-frame encoding fails, the encoded data generated by the multi-frame encoding will be used for the decoding instead.

However, it should be noted, normally, the data for generating the encoded data of the multi-frame encoding may be respectively located in a plurality of discontinuous PPUs. For instance, FIG. 13A is a schematic diagram illustrating a plurality of data for generating the encoded data of the multi-frame encoding respectively located in a plurality of discontinuous PPUs in the conventional art.

Figure 13:
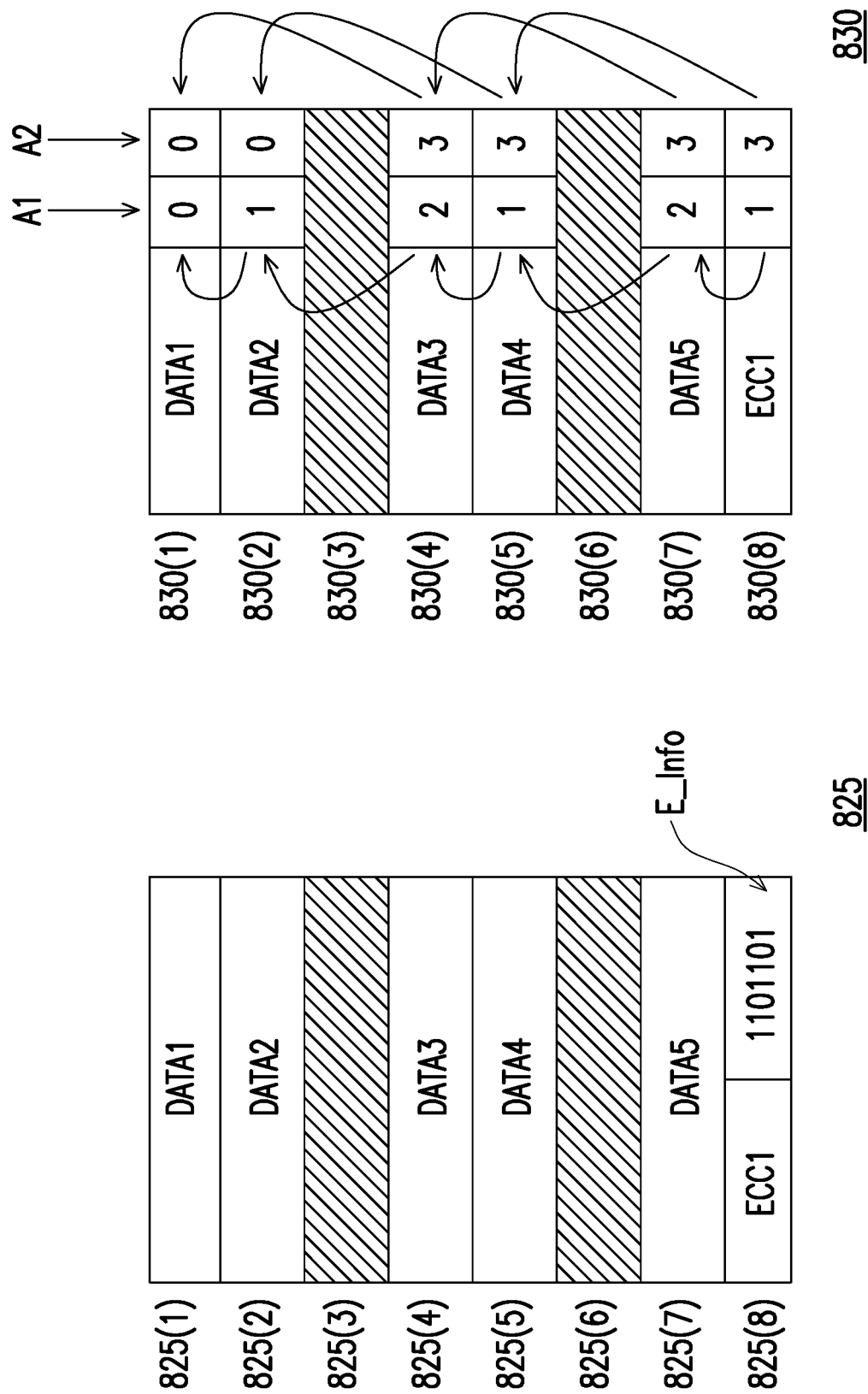
FIG. 13A is a schematic diagram illustrating a plurality of data for generating the encoded data of the multi-frame encoding respectively located in a plurality of discontinuous physical programming units in the conventional art.
FIG. 13B is a schematic diagram illustrating a data writing method according to an exemplary embodiment of the invention.

With reference to FIG. 13A, for descriptive convenience, it is assumed that the RNVM module 406 includes a PEU 825 in the example of FIG. 13A. The PEU 825 has PPUs 825(1) to 825(8). When the MMC 702 receives data DATA1 to DATA5 from the host system 11, the MMC 702 can write the data DATA1 to DATA5 into the PPUs 825(1) to 825(2), 825(4) to 825(5) and 825(7), respectively. Here, it should be noted that, although not shown in FIG. 13A, each PPU among the PPUs 825(1) to 825(2), 825(4) to 825(5) and 825(7) further includes the redundancy bit area, and the redundancy bit area is used to store the encoded data of the single-frame encoding. In addition, in this embodiment, the redundancy bit area further includes a plurality of bits reserved in advance and not used.

In this embodiment, it is assumed that the PPU 825(3) and the PPU 825(6) are not stored with data due to a program fail. Then, the MMC 702 can perform the multi-frame encoding according to the data DATA1 to DATA5 to generate encoded data ECC1, and write the encoded data ECC1 into the PPU 825(8). It should be noted that, in the conventional art, the PPU 825(8) for storing the encoded data ECC1 of the multi-frame encoding needs to further record encoded information E_Info, which is used to record locations of the data DATA1 to DATA5 for generating the encoded data ECC1. More specifically, in this embodiment, since the PPUs 825(1) to 825(8) are located in the same PEU 825, the MMC 702 can use a bitmap to represent aforesaid encoded data E_Info. In the exemplary embodiment of FIG. 13A, a value of the encoded information E_Info is "1101101". Here, from the bit at the leftmost of the value of the encoded information E_Info, the first bit corresponds to the PPU 825(1), the second bit corresponds to the PPU 825(2), the third bit corresponds to the PPU 825(3), and so on and so forth. In the encoded information E_Info, the bit with the bit value being "1" indicates that the PPU corresponding to that bit is stored with the data for generating the encoded data ECC1, and the bit with the bit value being "0" indicates that the PPU corresponding to that bit is not stored with the data for generating the encoded data ECC1.

For instance, the bit value of the first bit from the leftmost in the encoded data E_Info being "1" indicates that the PPU 825(1) is stored with the data for generating the encoded data ECC1. As another example, the bit value of the third bit from the leftmost in the encoded data E_Info being "0" indicates that the PPU 825(3) is not stored with the data for generating the encoded data ECC1.

Based on the above, it is assumed that, when the data in the PPU 825(1) is read, the data read from the PPU 825(1) may first be decoded by using the redundancy bit (e.g., the encoded data of the single-frame encoding, which is not illustrated) in the PPU 825(1) for the error checking and correcting. However, when the decoding performed by using the redundancy bit in the PPU 825(1) fails, the MMC 702 can read the encoded data ECC1, and learn that the data for generating the encoded data ECC1 are stored in the PPUs 825(2), 825(4) to 825(5) and 825(7) according to the encoded information E_Info. In this way, the MMC 702 can read the encoded data ECC1 and the data DATA2 to DATA5 stored in the PPUs 825(2), 825(4) to 825(5) and 825(7), and perform the decoding according to the encoded data ECC1 and the data DATA2 to DATA5, so as to attempt correcting errors existing in the data stored in the PPU 825(1).

It should be noted that, an error checking and correcting capability of the encoded data ECC1 is positively proportional to the number of bits of the encoded data ECC1. In a storage method of FIG. 13A, since the PPU 825(8) for storing the encoded data ECC1 needs to use more bits for storing the encoded information E_Info, this situation results in fewer bits of the encoded data ECC1, which in turn causes the problem of the error checking and correcting capability of the encoded data ECC1 being lower. Further, as can be clearly seen from FIG. 13A, a format of the PPUs 825(1) to 825(2), 825(4) to 825(5) and 825(7) for recording the data DATA1 to DATA5 written by the host system 11 is different from a format of the PPU 825(8) for storing the encoded data ECC1. Consequently, complexity in algorithm design and costs in hardware design are both increased. Further, if the encoded data ECC1 of the multi-frame encoding is stored in a PEU and that PEU is different from the PEU where the data DATA1 to DATA5 are located, the time for writing and reading the encoded data ECC1 may also be increased.

Accordingly, the invention proposes a data writing method that can increase the number of bits of the encoded data to improve the error checking and correcting capability of the encoded data. Further, in the data writing method of the invention, because the format of the PPU for storing data written by the host system is identical the format of the PPU for storing the encoded data of the multi-frame encoding, complexity in algorithm design and costs in hardware design may both be reduced. Further, in the data writing method of the invention, because the encoded data and the data for generating the encoded data are stored in the same PEU, the time for writing and reading the encoded data may be reduced.

More specifically, FIG. 13B is a schematic diagram illustrating a data writing method according to an exemplary embodiment of the invention.

With reference to FIG. 13B, for descriptive convenience, it is assumed that the RNVM module 406 includes a PEU 830 in the example of FIG. 13B. The PEU 830 has PPUs 830(1) to 830(8). In the data writing method of the invention, when the MMC 702 receives a plurality of data from the host system 11, the MMC 702 writes the data into i first PPUs, respectively. Here, i is a positive integer greater than 0.

With FIG. 13B as an example, when the MMC 702 receives data DATA1 to DATA5 from the host system 11, the MMC 702 can write the data DATA1 to DATA5 into the PPUs 830(1) to 830(2), 830(4) to 830(5) and 830(7) (i.e., "the first PPUs" described above), respectively. In the embodiment of FIG. 13B, a value of i is 5. However, the value of i is not particularly limited in the invention. Further, in the embodiment of FIG. 13B, it is assumed that the PPU 830(3) and the PPU 830(6) are not stored with data due to the program fail.

Then, the MMC 702 can perform the multi-frame encoding according to the data DATA1 to DATA5 to generate encoded data ECC2, and write the encoded data ECC2 into the PPU 830(8) (a.k.a. a second PPU).

It should be noted that, in this embodiment, each PPU among the PPUs 830(1) to 830(2), 830(4) to 830(5) and 830(7) needs to further store first concatenated information related to the encoded data ECC2. The MMC 702 writes the plurality of first concatenated information related to the encoded data into the i first PPUs, respectively. In particular, the first concatenated information of a k-th first PPU among the i first PPUs is configured to record a position of at least one other PPU among the i first PPUs excluding the k-th first PPU. In this exemplary embodiment, the position of the at least one other PPU includes a position of an n-th first PPU. Here, n is a positive integer greater than 0 and less than k. In other words, in this embodiment, the position of the n-th first PPU is located in front of a position of the k-th first PPU. However, the invention is not limited in this regard. In other embodiments, the position of the n-th first PPU may also be located behind the position of the k-th first PPU.

In particular, with the position of the n-th first PPU located in front of the position of the k-th first PPU taken as an example, referring to the example of FIG. 13B in which it is assumed that the PPU 830(5) of FIG. 13B is the k-th first PPU described above, because the PPU 830(5) is the 4-th PPU of the 5 PPUs 830(1) to 830(2), 830(4) to 830(5) and 830(7) for storing the data DATA1 to DATA5 (i=5), the value of k is 4 in this example. Further, each PPU among the PPUs 830(1) to 830(2), 830(4) to 830(5) and 830(7) includes fields A1 and A2. Here, it should be noted that, although not shown in FIG. 13B, each PPU among the PPUs 825(1) to 825(2), 825(4) to 825(5) and 825(7) further includes the redundancy bit area, and the redundancy bit area is used to store the encoded data of the single-frame encoding. In particular, in this embodiment, a part or all of the bits originally reserved in advance and not used in the redundancy bit area of FIG. 13A may be configured as the fields A1 and A2.

The bit in the field A1 (a.k.a. a first bit) is configured to record a position of a (k−1)-th first PPU among the i first PPUs. Accordingly, the field A1 of the PPU 830(5) is configured to record a position of the 3-rd PPU (i.e., the PPU 830(4)) of the PPUs 830(1) to 830(2), 830(4) to 830(5) and 830(7). In this embodiment, since the PPU 830(4) is located in the first PPU in front as counted from the PPU 830(5), the MMC 702 records "1" in the field A1 of the PPU 830(5).

Further, the bit in the field A2 (a.k.a. a second bit) is configured to record a position of a (k−2)-th first PPU among the i first PPUs. Accordingly, the field A2 of the PPU 830(5) is configured to record a position of the 2-nd PPU (i.e., the PPU 830(2)) of the PPUs 830(1) to 830(2), 830(4) to 830(5) and 830(7). In this embodiment, since the PPU 830(2) is located in the third PPU in front as counted from the PPU 830(5), the MMC 702 records "3" in the field A2 of the PPU 830(5).

Again, the PPU 830(7) is used as another example to explain further. The PPU 830(7) is the 5-th PPU of the PPUs 830(1) to 830(2), 830(4) to 830(5) and 830(7) for storing the data DATA1 to DATA5, and thus the bit in the field A1 of the PPU 830(7) will be used to record a position of the 4-th PPU (i.e., the PPU 830(5)) of the PPUs 830(1) to 830(2), 830(4) to 830(5) and 830(7). Since the PPU 830(5) is located in the second PPU in front as counted from the PPU 830(7), the MMC 702 records "2" in the field A1 of the PPU 830(7).

In addition, the field A2 of the PPU 830(7) is configured to record a position of the 3-rd PPU (i.e., the PPU 830(4)) of the PPUs 830(1) to 830(2), 830(4) to 830(5) and 830(7). In this embodiment, since the PPU 830(4) is located in the third PPU in front as counted from the PPU 830(7), the MMC 702 records "3" in the field A2 of the PPU 830(7).

Based on the method described above, a recording method of the fields A1 and A2 of the PPUs 830(1) to 830(2) and 830(4) may be similar to a recording method of the fields A1 and A2 of the PPU 830(5) (or the PPU 830(7)), which is not repeated hereinafter. In particular, since the first PPU and the second PPU located in front of the PPU 830(1) as counted from the PPU 830(1) do not exist, the field A1 and the field A2 of the PPU 830(1) are respectively filled with "0". Further, since the second PPU located in front of the PPU 830(2) as count from the PPU 830(2) does not exist, the field A2 of the PPU 830(2) is filled with "0".

Here, it should be noted that in the example above, the first concatenated information of a specific PPU is configured to record positions of the first and the second PPUs located in front of the specific PPU as counted from the specific PPU. However, the invention is not limited in this regard. In practice, the number of the positions of the PPUs located in front of the specific PPU as counted from the specific PPU may be determined according to an algorithm used in the multi-frame encoding.

In the example of FIG. 13B, the MMC 702 further writes another concatenated information (a.k.a. second concatenated information) into the PPU 830(8) stored with the encoded data ECC2. In particular, the second concatenated information is configured to record a position of a j-th first PPU among the i first PPUs. Here, j is a positive integer greater than 0 and less than i+1. In other words, in this embodiment, the second concatenated information is configured to record a position of one (or some) of first PPUs among the i first PPUs.

With reference to the example in FIG. 13B, the PPU 830(8) of FIG. 13B is used to store the encoded data ECC2 described above. The PPU 830(8) includes the fields A1 and A2. In this embodiment, the bit in the field A1 of the PPU for storing the encoded data (a.k.a. a third bit) is configured to record a position of an i-th first PPU among the i first PPUs. Accordingly, the field A1 of the PPU 830(8) is configured to record a position of the 5-th PPU (i.e., the PPU 830(7)) of the PPUs 830(1) to 830(2), 830(4) to 830(5) and 830(7). In this embodiment, since the PPU 830(7) is located in the first PEU in front as counted from the PPU 830(8), the MMC 702 records "1" in the field A1 of the PPU 830(8).

In addition, the bit in the field A2 of the PPU for storing the encoded data (a.k.a. a fourth bit) is configured to record a position of an (i−1)-th first PPU among the i first PPUs. Accordingly, the field A2 of the PPU 830(8) is configured to record a position of the 4-th PPU (i.e., the PPU 830(5)) of the PPUs 830(1) to 830(2), 830(4) to 830(5) and 830(7). In this embodiment, since the PPU 830(5) is located in the third PEU in front as counted from the PPU 830(8), the MMC 702 records "3" in the field A2 of the PPU 830(8).

Based on the above, it is assumed that, when the data in the PPU 830(1) is read, the data read from the PPU 830(1) may first be decoded by using the redundancy bit (e.g., the encoded data of the single-frame encoding, which is not illustrated) in the PPU 830(1) for the error checking and correcting. However, when the decoding performed by using the redundancy bit in the PPU 830(1) fails, the MMC 702 can read the fields A1 and A2 of the PPU 830(8) to learn that the data DATA5 is stored in the PPU 830(7), read the fields A1 and A2 of the PPU 830(7) to learn that the data DATA4 is stored in the PPU 830(5), read the fields A1 and A2 of the PPU 830(5) to learn that the data DATA3 is stored in the PPU 830(4), and read the fields A1 and A2 of the PPU 830(4) to learn that the data DATA2 is stored in the PPU 830(2).

Then, the MMC 702 can read the encoded data ECC2 and the data DATA2 to DATA5 stored in the PPUs 830(2), 830(4) to 830(5) and 830(7), and perform the decoding according to the encoded data ECC2 and the data DATA2 to DATA5, so as to attempt correcting errors existing in the data stored in the PPU 830(1).

It is worth noting that, a format for recording data in the PPU 830(8) (i.e., the second PPU) is identical to a format for recording data in each PPU among the PPUs 830(1) to 830(2), 830(4) to 830(5) and 830(7). In this way, complexity in algorithm design and costs in hardware design are both reduced.

In addition, since the PPU 830(8) and the PPUs 830(1) to 830(2), 830(4) to 830(5) and 830(7) all belong to the same PEU 830 (a.k.a. a first PEU), the time for writing and reading the encoded data ECC2 may be reduced.

Figure 14:
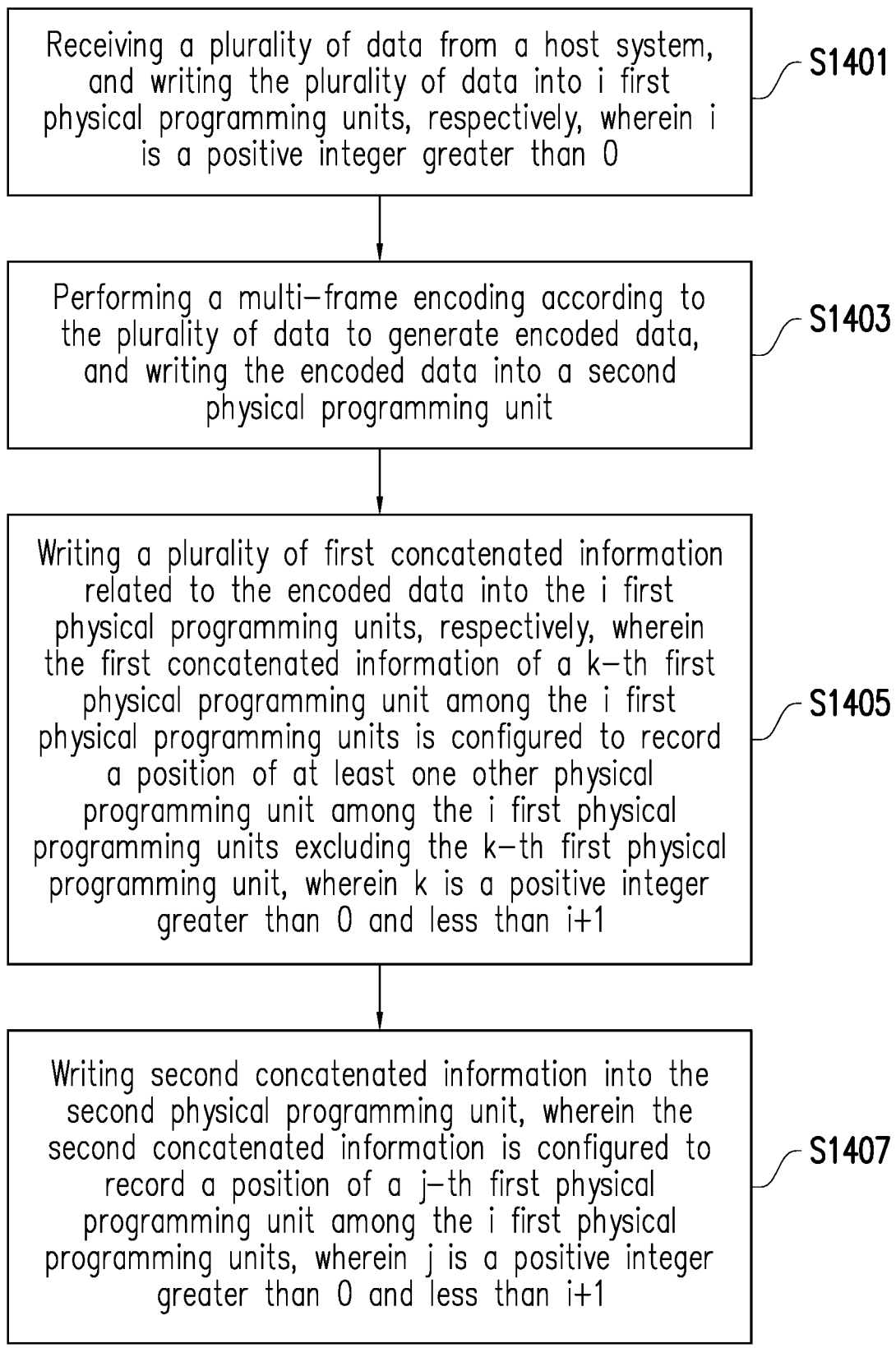
FIG. 14 is a flowchart of a data writing method according to an exemplary embodiment of the invention.

FIG. 14 is a flowchart of a data writing method according to an exemplary embodiment of the invention.

With reference to FIG. 14, in step S1401, the MMC 702 receives a plurality of data from the host system 11, and writes the data into i first PPUs, respectively. Here, i is a positive integer greater than 0. In step S1403, the MMC 702 performs a multi-frame encoding according to the plurality of data to generate encoded data, and writes the encoded data into a second PPU. In step S1405, the MMC 702 writes a plurality of first concatenated information related to the encoded data into the i first PPUs, respectively. The first concatenated information of a k-th first PPU among the i first PPUs is configured to record a position of at least one other PPU among the i first PPUs excluding the k-th first PPU. Here, k is a positive integer greater than 0 and less than i+1. In step S1407, the MMC 702 writes second concatenated information into the second PPU. Here, the second concatenated information is configured to record a position of a j-th first PPU among the i first PPUs. Here, j is a positive integer greater than 0 and less than i+1.

In summary, the data writing method, the memory controlling circuit unit and the memory storage device of the invention can increase the number of bits of the encoded data to improve the error checking and correcting capability of the encoded data. Further, in the data writing method of the invention, because the format of the PPU for storing data written by the host system is identical the format of the PPU for storing the encoded data of the multi-frame encoding, complexity in algorithm design and costs in hardware design may both be reduced. Further, in the data writing method of the invention, because the encoded data and the data for generating the encoded data are stored in the same PEU, the time for writing and reading the encoded data may be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data writing method for a rewritable non-volatile memory module, wherein the rewritable non-volatile memory module has a plurality of physical erasing units, each physical erasing unit among the plurality of physical erasing units has a plurality of physical programming units, and the memory writing method comprises:

receiving a plurality of data from a host system, and writing the plurality of data into i first physical programming units among the plurality of physical programming units, respectively, wherein i is a positive integer greater than 0;

performing a multi-frame encoding according to the plurality of data to generate encoded data, and writing the encoded data into a second physical programming unit among the plurality of physical programming units; and writing a plurality of first concatenated information related to the encoded data into the i first physical programming units, respectively, wherein the plurality of first concatenated information are configured to record locations of the plurality of data in the i first physical programming units.

2. The data writing method according to claim 1, wherein the first concatenated information of a k-th first physical programming unit among the i first physical programming units is configured to record a position of at least one other physical programming unit among the i first physical programming units excluding the k-th first physical programming unit, wherein k is a positive integer greater than 0 and less than i+1.

3. The data writing method according to claim 2, wherein the position of the at least one other physical programming unit comprises a position of an n-th first physical programming unit among the i first physical programming units, wherein n is a positive integer greater than 0 and less than k.

4. The data writing method according to claim 2, wherein the first concatenated information of the k-th first physical programming unit comprises at least one first bit and at least one second bit, the at least one first bit is configured to record a position of a (k−1)-th first physical programming unit among the i first physical programming units and the at least one second bit is configured to record a position of a (k−2)-th first physical programming unit among the i first physical programming units.

5. The data writing method according to claim 1, wherein a step of performing the multi-frame encoding according to the plurality of data to generate the encoded data, and writing the encoded data into the second physical programming unit among the plurality of physical programming units comprises:

writing second concatenated information into the second physical programming unit, wherein the second concatenated information is configured to record a position of a j-th first physical programming unit among the i first physical programming units, wherein j is a positive integer greater than 0 and less than i+1.

6. The data writing method according to claim 5, wherein the second concatenated information comprises at least one third bit and at least one fourth bit, the at least one third bit is configured to record a position of an i-th first physical programming unit among the i first physical programming units and the at least one fourth bit is configured to record a position of an (i−1)-th first physical programming unit among the i first physical programming units.

7. The data writing method according to claim 1, wherein a format for recording data in the second physical programming unit is identical to a format for recording data in each first physical programming unit among the i first physical programming units.

8. The data writing method according to claim 1, wherein the i first physical programming units and the second physical programming unit belong to a first physical erasing unit among the plurality of physical erasing units.

9. A memory controlling circuit unit for a rewritable non-volatile memory module, the rewritable non-volatile memory module having a plurality of physical erasing units, each physical erasing unit among the plurality of physical erasing units having a plurality of physical programming units, the memory controlling circuit unit comprising:
a host interface, configured to couple to a host system;
a memory interface, configured to couple to the rewritable non-volatile memory module; and
a memory management circuit, coupled to the host interface and the memory interface,
wherein the memory management circuit is configured to receive a plurality of data from a host system, and write the plurality of data into i first physical programming units among the plurality of physical programming units, respectively, wherein i is a positive integer greater than 0,
wherein the memory management circuit is further configured to perform a multi-frame encoding according to the plurality of data to generate encoded data, and write the encoded data into a second physical programming unit among the plurality of physical programming units,
wherein the memory management circuit is further configured to write a plurality of first concatenated information related to the encoded data into the i first physical programming units, respectively, wherein the plurality of first concatenated information are configured to record locations of the plurality of data in the i first physical programming units.

10. The memory controlling circuit unit according to claim 9, wherein the first concatenated information of a k-th first physical programming unit among the i first physical programming units is configured to record a position of at least one other physical programming unit among the i first physical programming units excluding the k-th first physical programming unit, wherein k is a positive integer greater than 0 and less than i+1.

11. The memory controlling circuit unit according to claim 10, wherein the position of the at least one other physical programming unit comprises a position of an n-th first physical programming unit among the i first physical programming units, wherein n is a positive integer greater than 0 and less than k.

12. The memory controlling circuit unit according to claim 10, wherein the first concatenated information of the k-th first physical programming unit comprises at least one first bit and at least one second bit, the at least one first bit is configured to record a position of a (k−1)-th first physical programming unit among the i first physical programming units and the at least one second bit is configured to record a position of a (k−2)-th first physical programming unit among the i first physical programming units.

13. The memory controlling circuit unit according to claim 9, wherein in the operation of performing the multi-frame encoding according to the plurality of data to generate the encoded data, and writing the encoded data into the second physical programming unit among the plurality of physical programming units,
the memory management circuit is further configured to write second concatenated information into the second physical programming unit, wherein the second concatenated information is configured to record a position of a j-th first physical programming unit among the i first physical programming units, wherein j is a positive integer greater than 0 and less than i+1.

14. The memory controlling circuit unit according to claim 13, wherein the second concatenated information comprises at least one third bit and at least one fourth bit, the at least one third bit is configured to record a position of an i-th first physical programming unit among the i first physical programming units and the at least one fourth bit is configured to record a position of an (i−1)-th first physical programming unit among the i first physical programming units.

15. The memory controlling circuit unit according to claim 9, wherein a format for recording data in the second physical programming unit is identical to a format for recording data in each first physical programming unit among the i first physical programming units.

16. The memory controlling circuit unit according to claim 9, wherein the i first physical programming units and the second physical programming unit belong to a first physical erasing unit among the plurality of physical erasing units.

17. A memory storage device, comprising:
a connection interface unit, configured to couple to a host system;
a rewritable non-volatile memory module, the rewritable non-volatile memory module having a plurality of physical erasing units, each physical erasing unit among the physical erasing units having a plurality of physical programming units; and
a memory controlling circuit unit, coupled to the connection interface unit and the rewritable non-volatile memory module,
wherein the memory controlling circuit unit is configured to receive a plurality of data from a host system, and write the plurality of data into i first physical programming units among the plurality of physical programming units, respectively, wherein i is a positive integer greater than 0,
wherein the memory controlling circuit unit is further configured to perform a multi-frame encoding according to the plurality of data to generate encoded data, and write the encoded data into a second physical programming unit among the plurality of physical programming units,
wherein the memory controlling circuit unit is further configured to write a plurality of first concatenated information related to the encoded data into the i first physical programming units, respectively, wherein the plurality of first concatenated information are configured to record locations of the plurality of data in the i first physical programming units.

18. The memory storage device according to claim 17, wherein the first concatenated information of a k-th first physical programming unit among the i first physical programming units is configured to record a position of at least one other physical programming unit among the i first physical programming units excluding the k-th first physical programming unit, wherein k is a positive integer greater than 0 and less than i+1.

19. The memory storage device according to claim 18, wherein the position of the at least one other physical programming unit comprises a position of an n-th first physical programming unit among the i first physical programming units, wherein n is a positive integer greater than 0 and less than k.

20. The memory storage device according to claim 18, wherein the first concatenated information of the k-th first physical programming unit comprises at least one first bit and at least one second bit, the at least one first bit is configured to record a position of a (k−1)-th first physical programming unit among the i first physical programming units and the at least one second bit is configured to record a position of a (k−2)-th first physical programming unit among the i first physical programming units.

21. The memory storage device according to claim 17, wherein in the operation of performing the multi-frame encoding according to the plurality of data to generate the encoded data, and writing the encoded data into the second physical programming unit among the plurality of physical programming units, the memory controlling circuit unit is further configured to write second concatenated information into the second physical programming unit, wherein the second concatenated information is configured to record a position of a j-th first physical programming unit among the i first physical programming units, wherein j is a positive integer greater than 0 and less than i+1.

22. The memory storage device according to claim 21, wherein the second concatenated information comprises at least one third bit and at least one fourth bit, the at least one third bit is configured to record a position of an i-th first physical programming unit among the i first physical programming units and the at least one fourth bit is configured to record a position of an (i−1)-th first physical programming unit among the i first physical programming units.

23. The memory storage device according to claim 17, wherein a format for recording data in the second physical programming unit is identical to a format for recording data in each first physical programming unit among the i first physical programming units.

24. The memory storage device according to claim 17, wherein the i first physical programming units and the second physical programming unit belong to a first physical erasing unit among the plurality of physical erasing units.

* * * * *